United States Patent [19]

Eggerding et al.

[11] 4,272,500
[45] Jun. 9, 1981

[54] PROCESS FOR FORMING MULLITE

[75] Inventors: Carl L. Eggerding, Wappingers Falls; Frank Gonzales, Jr., Poughkeepsie; Jerzy B. Niklewski, Wappingers Falls, all of N.Y.

[73] Assignee: International Business Machines Corporation, Armonk, N.Y.

[21] Appl. No.: 91,868

[22] Filed: Nov. 6, 1979

Related U.S. Application Data

[63] Continuation-in-part of Ser. No. 904,112, May 8, 1978, abandoned.

[51] Int. Cl.³ .................... C01B 33/36; C04B 35/64
[52] U.S. Cl. ................................... 423/327; 106/65; 106/73.4; 264/56; 264/61; 264/63
[58] Field of Search ................ 423/327, 328; 106/65, 106/69, 73.4, 73.5; 264/56, 58, 63, 61

[56] References Cited

U.S. PATENT DOCUMENTS

| | | | |
|---|---|---|---|
| 1,752,867 | 4/1930 | Trostel | 106/65 |
| 1,786,482 | 12/1930 | Curtis | 106/65 |
| 1,802,296 | 4/1931 | Willetts | 106/65 X |
| 3,826,813 | 7/1974 | Gardner et al. | 423/327 |
| 3,857,923 | 12/1974 | Gardner et al. | 423/327 |
| 3,989,783 | 11/1976 | McGee | 264/56 |

FOREIGN PATENT DOCUMENTS 716265  9/1954  United Kingdom ..................... 106/65

Primary Examiner—Edward J. Meros
Attorney, Agent, or Firm—Wolmar J. Stoffel

[57] ABSTRACT

A method of forming ceramic material which includes mullite ($3Al_2O_3 \cdot 2SiO_2$) in any desired percentage. A particulate mixture is formed of (1) mullite in an amount of at least 5% by weight, (2) $Al_2O_3$ in an amount to provide sufficient $SiO_2$ to combine with $Al_2O_3$ to form the desired mullite. The mixture is sintered to a temperature in the range of 1300° C. to 1600° C. wherein the $Al_2O_3$ and $SiO_2$ react to form mullite under the influence of the initially added mullite.

6 Claims, No Drawings

PROCESS FOR FORMING MULLITE

This application is a continuation-in-part of application Ser. No. 904,112 filed on May 8, 1978, now abandoned.

DESCRIPTION

1. Technical Field

This invention relates to a method of forming mullite, more particularly to a method of forming a ceramic material which includes high purity mullite in any desired amount.

An object of this invention is to provide a method of forming high purity dense mullite from $Al_2O_3$ and glass that contains $Al_2O_3$ and $SiO_2$.

Another object of this invention is to provide a method of forming a dense sintered ceramic material which includes high purity mullite as a component thereof. (Dense is defined as zero apparent or open porosity and high purity mullite is defined as mullite with very little iron, titanium or alkali metal impurities.)

Yet another object of this invention is to provide a method for forming a dense sintered ceramic material wherein $Al_2O_3$ and $SiO_2$ are reacted to form high purity mullite in any desired amount of the final material.

Another object of this invention is to provide a method for forming ceramic material which includes mullite by reacting $Al_2O_3$ and $SiO_2$ during a sintering step wherein the reaction is initiated by a relatively small amount of mullite included in the original particulate material.

Another object of this invention is to provide a method of forming a ceramic composition where the mullite portion can be varied from approximately 10% to 100%.

An object of this invention is to provide a high purity dense ceramic material with mullite content that can be varied as required and where the ceramic material can be used to manufacture multi-layered ceramic substrates complete with confined metallurgy.

2. Background Art

Mullite ($3Al_2O_3.2SiO_2$) has long been known in the ceramic and refractory industries. Mullite is the most stable compound in the $Al_2O_3$-$SiO_2$ system. Consequently, it occurs as a main constituent in a large number of ceramic products which are fabricated from aluminosilicate materials. Considerable amounts of mullite are used to produce refractory bodies designed to withstand high temperatures. Its relatively low thermal coefficient of expansion makes such refractories more resistant to thermal stresses in contrast to similar bodies prepared from aluminum oxide materials.

Mullite possesses a dielectric constant of approximately 5 to 6 and therefore presents a very attractive electrical characteristic as integrated circuit technology continues advancing to higher speed circuit devices. Moreover, mullite's low thermal coefficient of expansion offers an excellent match to large silicon integrated circuit chips or glass layer which may be placed on substrates. Although mullite has been mentioned for use as multi-layer electronic substrates for integrated circuit devices, high purity, dense substrates are not known to exist.

Commercially available mullite always contains significant amounts of impurities such as silica, iron oxide, and titania. These impurities influence the physical, electrical, and chemical properties of the mullite, which in turn affect the ceramic compositions of which mullite may be embodied in. Mullite can be produced, as described in U.S. Pat. Nos. 3,857,923, 3,922,333, 3,615,778, and 3,336,108.

Other known mullite fabrication techniques are as follows:

(1) The most common technique for mullite fabrication involves the heating of clays, feldspars, hyanites, etc. to a temperature in excess of 1300° C. The degree of completeness of the reaction is dependent on temperature and the time the sample is held at temperature. The higher the reaction temperature, the less the dwell time at temperature. During heating, the clay structure breaks down to form mullite and an amorphous silica phase. This silica glass is very viscous and can either crystallize to a crystalline silica phase such as tridymite or cristobalite, or it can react with excess alumina that may have been added to the initial raw material mixture. This reaction would also yield mullite. Again, the degree of completion of this reaction is dependent on temperature and sample time at temperature.

If alumina and clay are mixed in the proper properties, production of a 100% mullite body is feasible. This is the technique outlined by Willetts in U.S. Pat. No. 1,802,296. However, as the chemical reaction sequence has a volume change associated with it, plus the sintering reaction step that occurs simultaneously also has a volume change associated with it, the fabrication of 100% mullite articles by this technique to rigid dimensional specifications becomes very difficult, if not impossible. Therefore, the common method to circumvent this problem is to pre-react a portion of the material to 100% mullite and then grind this material and add it to a mixture of the initial raw material mixture. The ceramic industry term for any pre-reacted material is grog. This mixture of grog and initial raw material mixture of ten called binder is then fabricated into the desired shape and sintered at a high temperature to convert the raw material mixture to mullite and drive the sintering reaction to a satisfactory end-point. This description is the art as outlined by Willetts. Variations of this technique are possible. British Pat. No. 716,265 is essentially identical, except that the method of fabricating the grog is different. Specifically, the British Patent describes a grog fabrication process that heats the $Al_2O_3$ and $SiO_2$ (in proper proportions) to a temperature in excess of the mullite melting temperature. The liquid mullite is then cooled and allowed to crystallize to mullite crystals. These crystals are then ground to a powder and mixed with the naturally occurring raw materials. The mixture is then shaped and sintered. This process uses raw materials that will always form some mullite when heated sufficiently, and produce a glass phase that can be reacted to form additional mullite.

Using the technique as outlined in the British Patent does not produce a mullite body which, after sintering, has 0% apparent porosity. In addition, the technique outlined by Willetts does not operate optimally if wet fabrication processes are used. Willetts states that wet fabrication techniques result in lower bulk densities, and therefore higher porosities than dry fabrication techniques.

(2) The second method of fabricating mullite is by processes that do not use any glass phase at any point in the process. This solid state reaction technique makes use of the fact that the equilibrium $Al_2O_3$—$SiO_2$ phase diagram predicts that if $Al_2O_3$ and $SiO_2$ are in contact and heated sufficiently, mullite will form as a natural product. This technique requires the $Al_2O_3$ and $SiO_2$ to diffuse to a common boundary and react chemically. The distance the constituents diffuse is primarily influenced by the temperature, the time the material is held at temperature, and the particle size of the raw materials. This is the essence of the art as practiced by Gardner and Wilcox in U.S. Pat. Nos. 3,826,813 and 3,857,923. In U.S. Pat. No. 3,826,813, $Al_2O_3$ and $SiO_2$ are mixed as the reaction proceeds. The rate decreases rapidly because the diffusion distances become longer. Therefore, the reaction is interrupted before completion and before completion of the simultaneously-occurring sintering reaction. Since sintering is not complete, the material is relatively weak, and therefore can be ground easily. The grinding step reduces the particle size and therefore the diffusion distance when the powder is re-assembled and resintered. The grinding reaction does cause some contamination. In this case, the contaminant is $Al_2O_3$ which can also react to form mullite. If the initial raw material mixture is prepared with the a priori knowledge that additional $Al_2O_3$ will be added later, the net result after the second thermal step will be 100% mullite. Gardner and Wilcox do not make any assertion for 0% open porosity using this technique.

In U.S. Pat. No. 3,857,923, Gardner and Wilcox prepare ultra-fine $Al_2O_3$ and $SiO_2$ powders by flame pyrolysis. This technique drastically reduces the diffusion distance and makes possible the production of 100% mullite and complete sintering to 0% open porosity. The utilization of such ultra-fine particle sizes in a sheet casting technique for sample fabrication is very difficult, if not impossible. Therefore a recognized need for a practical commercial process for producing high purity dense mullite using doctor blade techniques has not been met by the prior art techniques. It is particularly desirable that the mullite can be formed in various concentrations in ceramic compositions whereby the physical, electrical, and chemical properties of the ceramic composition can be tailored.

DISCLOSURE OF THE INVENTION

In this process a particulate mixture of raw materials is formed which contains crystalline alpha alumina, a glass that is made up of aluminum oxide, silicon dioxide, and alkaline earth oxides, and mullite. By the use of the proper ratios of these materials and by the proper chemical composition of the glass phase, a process that allows any desired amount of high parity mullite up to 100% and the development of a dense, 0% apparent porosity, ceramic article in one thermal operation is possible.

The novelty of this disclosure is that the glass phase promotes the densification of the particulate mixture and is the medium in which aluminum oxide and silicon dioxide react to form mullite. The reaction to form mullite is not possible unless some minimum amount of mullite is added to the raw material mixture.

The initially added mullite acts as a nucleant or "seed" that allows the reaction between aluminum oxide and silicon dioxide to proceed to its equilibrium state. If the mullite had not been added, the mixture of alpha alumina and glass would not have formed any mullite, however, the mixture of alpha alumina and glass would sinter to a 0% apparent porosity.

Any desired amount of mullite can be formed, up to substantially 100%. In order to form 100% mullite ceramic material the stoichiometric amounts of $Al_2O_3$ and $SiO_2$ (added as a glass) are combined with the initial mullite seed. During the sintering the components are formed into mullite. If less than 100% mullite is desired, the ratio of total alumina content to silica content must be in excess of the stoichiometric ratio. After reaction, this will leave the desired mullite plus alumina phase structure.

The particulate mixture is combined with an organic binder, solvent, and plasticizer, to form a slurry which can be doctor bladed and dried to form ceramic green sheet, as described in U.S. Pat. No. 2,966,119. The green sheet is then punched, and metallurgy is screened on, a plurality of sheets is laminated, and the resultant unit sintered to form a multi-layer ceramic substrate.

The desirability of combining various amounts of mullite into ceramic materials used as semiconductor package substrate is apparent when one considers the coefficient of expansion of mullite, silicon, and other ceramic materials. The coefficient of expansion of pure mullite from room temperature to 300° C. is $40 \times 10^{-7}/°$ C. The coefficient of expansion of $Al_2O_3$ is $75 \times 10^{-7}/°$ C., and typical high alumina ceramics are on the order of $70 \times 10^{-7}/°$ C. The coefficient of expansion of molybdenum, used as a refractory conductive metallurgy material on MLC substrates, is $55 \times 10^{-7}/°$ C. which is between high alumina ceramic materials and mullite. A match of coefficients of expansion of molybdenum and a ceramic substrate material which includes the proper amount of mullite can thus be achieved, which would reduce cracking, distortion and internal stress of the substrate which uses molybdenum metallurgy. Also, a pure mullite substrate would provide a relatively good coefficient of expansion match to silicon which has a coefficient of expansion of $32 \times 10^{-7}/°$ C. This substrate could be important when a silicon device is solder bonded to the substrate.

The dielectric constant of mullite is 5–6 as compared to high alumina ceramic with a dielectric constant of on the order of 9 to 9½. The use of mullite in a ceramic would reduce the dielectric constant which is important in reducing inductance in high speed switching applications.

With this process it is possible to achieve a dense, 0% apparent porosity, ceramic with a very low or essentially 0 percent glassy phase. Chemical attack of a ceramic material occurs normally in the glassy phase. Thus, the process could be used to produce a ceramic body with improved chemical inertness.

In the forming of the particulate material, the $Al_2O_3$ is preferably alpha alumina of 99+ percent purity which is commercially available. The mullite used as seed can be any mullite material including commercially available mullite of 90+ percent purity. The impurities present in the seed mullite when dispersed through the body would not significantly effect the electrical, chemical, and physical properties of the resultant ceramic material. Any suitable type of glass having a high percentage of $SiO_2$ can be used in the practice of the invention. As a practical application the mullite seed is added to an existing glass which includes both $SiO_2$ and $Al_2O_3$. A typical glass useful in practicing the invention contains 52% $SiO_2$, 31% $Al_2O_3$, 10% MgO and 7% CaO by weight. When mullite is added to this glass and the mixture sintered, the alumina and silica in the glass react at a ratio of 72 to 28 to form additional mullite.

The types of glasses that are suitable for use in this process are the aluminosilicate glasses with the glass viscosity at the firing temperature and the desired amount of silica being the governing factors. Too fluid a glass will deform the body while too high a viscosity will make the reaction proceed too slowly. The glass composition should have between 80 and 40% silica content. The particle size of the particulate mixture of the invention is preferably on the order of −325 mesh. However, the particle size can be varied if desired. The ultimate fineness of the particles possible is governed by the difficulty of manufacturing the desired shapes. The maximum coarseness of the powder used is governed by the length of time that it is required to complete the reaction. The more coarse the powder the greater the time the body must be sintered. The method of the invention is particularly applicable to multilayer ceramic technology where the particulate mixture is combined with a binder, a solvent, and preferably a plasticizer, the resultant slurry doctor bladed and dried to form green sheet. The sintering atmosphere used in the practice of the method of the invention can include either wet hydrogen, air, forming gas, nitrogen, argon, or any other suitable atmosphere. In general, the nature of the atmosphere does not effect the mullite formation. However, various types of atmospheres may be desirable in order to avoid adverse effects on the metallurgy associated with the ceramic substrate. The sintering temperature used in the method of the invention is any suitable temperature, preferably in the range of 1300° C. to 1600° C. and more preferably in the range of 1450° C. to 1550° C. The required sintering time will vary depending on the nature of the particulate mixture and the coarseness of the particle. In general, the sintering time will range from ½ to 24 hours, more typically in the range of 1 to 6 hours. The particle size of the components of the particulate mixture can be any suitable size, preferably on the order of −325 mesh. The mullite component in the particulate mixture is present in an amount to provide sufficient nucleation. The preferred amount is from 5 to 90% by weight, more preferably 5 to 30%. The amount of $SiO_2$ in the mixture can be any amount up to the stoichiometric amount necessary to result in a final mixture of up to 100% mullite. However, any lesser amount can be used.

The following examples are included to illustrate typical illustrations of the practice of the method of the invention and should not be construed to limit the scope of the invention.

EXAMPLE 1

A mixture of 20 parts by weight of mullite, 11 parts by weight of glass, and 69 parts by weight of alumina were placed in a ball mill. An organic mixture consisting of 21 parts by weight of methanol, 63 parts by weight of methylisobutylketone, 3 parts by weight of dipropylene glycol dibenzoate, and 12 parts by weight of polyvinylbutyral were added such that the weight ratio of ceramics to organics was 1.82. The ceramic was milled so that all particles passed through a 325 mesh screen. The slurry was deaired and cast under a doctor blade onto a moving organic film to form a ceramic green sheet. The sheet was then dried and sized. Ten green sheets were laminated together in a cavity die at a temperature of 95° C. and a pressure of 3000 psi.

The samples were then placed in a batch kiln and heated to 1560° C. in a wet hydrogen atmosphere. The samples were held at temperature for three hours. The fired samples were dense with no visible porosity.

After cooling, the samples were ground into a minus 200 mesh powder. This powder was then analyzed using an x-ray powder diffractometer with Cu Kα radiation. The results obtained were compared to the ASTM x-ray data. The x-ray trace showed a complete absence of the very broad peak indicative of a silicate glass phase. The only crystal phases detected were alumina and mullite.

This example proved that when the alumina to glass ratio in the original raw material mixture was such that there was an excess of alumina, the in situ mullite synthesis reaction occurred until the $SiO_2$ in the glass was essentially depleted. The amount of alumina in excess of the stoichiometric ratio did not react and remained as crystalline alpha alumina.

EXAMPLE 2

A mixture of 74.5 parts mullite, 14.5 parts alumina, and 11 parts glass powder was processed as described in Example 1. After sintering for 3 hours at 1560° C. a portion of the sample was then ground into minus 200 mesh powder, and the powder was analyzed using an x-ray diffractometer, as per the procedure in Example 1.

The results of this investigation showed that no crystalline alpha alumina phase remained. The alumina to glass ratio in this composition was tailored to give the stoichiometric ratio that would react fully to form mullite. The results do show that the reaction occurred as predicted, with no crystalline alumina remaining.

EXAMPLE 3

An additional sample was prepared as described in Example 1, except that the ceramic raw material composition was 30 parts by weight mullite, 11 parts by weight of glass powder, and 59 parts by weight alumina. Following the casting, drying, laminating, and sintering steps described in Example 1, a portion of the sample was mounted in molding material, and polished using standard metallographic techniques. The sample was then analyzed using an optical microscope, on which was mounted a recording micrometer stage. The stage was used to quantitatively measure by line intercept method the amount of the phases present. Extensive analysis showed that the above composition had a ratio of phase contents of 55.9% by volume, mullite, and 44.1% alpha alumina. Only residual (less than 2% by volume) glass phase was observed in this composition. Phase equilibrium diagrams for the $Al_2O_3$—$SiO_2$ system predict that the expected phases are mullite and alumina, in a ratio of 55 to 45, by volume. Therefore, this example proves that by adding mullite to a composition containing alumina and an aluminosilicate glass, the mullite nucleation step is bypassed and the growth of the mullite phase occurs by the reaction between the alumina and the glass phase to produce additional mullite. The amount of porosity and pullout observed was measured and found to be discontinuous and less than 7.6% by volume. Hence, the technique allowed for the production of dense mullite samples having 0% apparent porosity.

EXAMPLE 4

Mullite formation as a function of the sintering amounts of mullite was measured by forming as in Example 1, bodies having various initial compositions and firing them for 3 hours at 1560° C. The final percentages of mullite were calculated from x-ray diffraction patterns.

| Starting Compositions by Weight | | | Sintered Density | % Theoretical Density | Modules of Rupture psi | Fired Mullite Percentage by weight |
|---|---|---|---|---|---|---|
| % Mullite | % Glass | % Alpha Alumina | | | | |
| 5 | 11 | 84 | 3.643 | 95 | 41980 | 7 |
| 10 | 11 | 79 | 3.527 | 97 | 36590 | 13 |
| 15 | 11 | 74 | 3.497 | 97 | 31470 | 22 |
| 20 | 11 | 69 | 3.403 | 95 | 28760 | 27 |
| 25 | 11 | 64 | 3.345 | 95 | 27980 | 35 |
| 30 | 11 | 59 | 3.171 | 93 | 24680 | 45 |

The results showed that the amount of mullite formed varied from 30% to 50% as compared to the starting amounts and that the ease of mullite formation increased with increased mullite additions which provided additional nucleation sites. The sintered density values and the calculated % theoretical densities calculated from these values show that the ceramic body is dense with no continuous porosity. The modules of rupture values indicate that the bodies are strong, also an indication of less porosity. The glass alumina reaction to mullite did not go to completion in cases where less than 30% mullite and 11% glass was present due to heterogeneity in the ceramic body limiting the reaction.

EXAMPLE 5

The following raw material compositions were prepared as described in Example 1:

A. 3 parts mullite, 21.8 parts glass powder, 75.2 parts alumina, all by weight;

5 parts mullite, 20.7 parts glass powder 74.3 parts alumina, all by weight.

Samples A and B, were sintered in air for 3 hours at 1319° C. and 1328° C. respectively.

Portions of samples were mounted on carbon-coated electron microscope grids. Using the defocussed electron diffraction pattern technique, the amount of glass phase could be measured. For both compositions, 200 particles were examined to determine if the particles were crystalline (either mullite or alumina) or amorphous, i.e., glass particles. The results are as follows:

| Sample | Glass Particles per 200 Particles |
|---|---|
| A | 1 |
| B | 0 |

With no glass depletion a count of approximately 40 should have been observed.

The compositions of samples A and B should have yielded excess alumina. The glass phase should be depleted. As seen above in the results, this was indeed the case. The reaction to form mullite went to completion at 1320° C.

EXAMPLE 6

An alpha alumina-glass body having a composition of 89 parts by weight alpha alumina and 11 parts by weight glass was manufactured as in Example 1 and sintered at 1560° C. for 3 hours. The sample was ground and passed through a 200 mesh screen. An x-ray diffraction pattern of the powder was made using copper $K\alpha$ radiation. Only alpha alumina was visible in the x-ray pattern with a complete absence of mullite.

The glass phase was also looked for using the transmission electron microscopy technique as described in Example 5. Eleven particles of glass were found indicating the presence of the glass phase.

EXAMPLE 7

| Sample # | Density gms/cc | Theoretical Density | Added Mullite | Final Mullite |
|---|---|---|---|---|
| 1 | 3.48 | 97 | 20 | 27 |
| 2 | 3.48 | 97 | 20 | 27 |
| 3 | 3.48 | 97 | 20 | 27 |
| 4 | 3.49 | 98 | 20 | 27 |
| 5 | 3.49 | 98 | 20 | 27 |
| 6 | 3.47 | 97 | 20 | 27 |
| 7 | 3.49 | 98 | 20 | 27 |
| 8 | 3.47 | 97 | 20 | 27 |
| 9 | 3.49 | 98 | 20 | 27 |
| 10 | 3.48 | 97 | 20 | 27 |

In this example samples were manufactured as in example 4. The data indicates that the process is consistent and that the high densities can be routinely achieved with 0 percent apparent porosities.

We claim:

1. A method of fabricating a multi-layer ceramic substrate for an integrated circuit semiconductor package formed of a ceramic material composed of a high percentage of high purity dense mullite comprising forming a particulate ceramic mixture of (1) mullite in an amount in the range of 5 to 30% by weight, (2) $Al_2O_3$ in an amount such that it is from stoichiometric amount to excess as necessary to form the desired mullite composition percentage less the initially added mullite, and (3) aluminosilicate glass with an $SiO_2$ content in the range of 40 to 80% and including a significant amount of alkaline earth oxides, said glass in an amount to provide sufficient $SiO_2$ to combine with $Al_2O_3$ to form the desired mullite composition percentage, combining the particulate mixture with an organic binder resin, and a solvent for the resin to form a liquid dispersion, forming the liquid dispersion into a sheet, drying the resultant sheet to remove the solvent from the resin to thereby form a ceramic green sheet, laminating a plurality of processed green sheets, sintering the resultant laminated green sheet substrate at a temperature in the range of 1300° to 1600° C. for a time in the range of one-half to 24 hours to remove the binder resin and subsequently react the $Al_2O_3$ and $SiO_2$ in the glass to form dense mullite under the influence of the initially added mullite, the resultant substrate having 0% apparent porosity.

2. The method of claim 1 wherein said $Al_2O_3$ is present in said ceramic mixture in an amount in the range of 21 to 59% by weight, and said aluminosilicate glass is present in an amount in the range of 25 to 70% by weight.

3. The method of claim 1 wherein said sintering temperature is in the range of 1450° C. to 1550° C., and the sintering time is in the range of 1 to 6 hours.

4. The method of claim 1 wherein said binder is polyvinylbutyral.

5. The method of claim 1 an organic plasticizer is combined with said organic binder.

6. The method of claim 1 wherein said aluminosilicate glass includes 52% $SiO_2$, 31% $Al_2O_3$, 10% Mgo and 7% CaO.

* * * * *